United States Patent [19]
Kim

[11] Patent Number: 5,939,779
[45] Date of Patent: Aug. 17, 1999

[54] BOTTOM LEAD SEMICONDUCTOR CHIP STACK PACKAGE

[75] Inventor: Yong Chan Kim, Cheongju, Rep. of Korea

[73] Assignee: LG Semicon Co., Ltd., Choongcheongbuk-Do, Rep. of Korea

[21] Appl. No.: 08/856,317

[22] Filed: May 14, 1997

[30] Foreign Application Priority Data

May 17, 1996 [KR] Rep. of Korea ....................... 96-16640

[51] Int. Cl.⁶ ................................................. H01L 23/48
[52] U.S. Cl. ........................... 257/692; 257/673; 257/723; 257/686
[58] Field of Search ...................................... 257/666, 670, 257/672, 673, 676, 692, 723, 724, 777

[56] References Cited

U.S. PATENT DOCUMENTS

| | | | |
|---|---|---|---|
| 3,978,516 | 8/1976 | Noe | 357/70 |
| 5,172,214 | 12/1992 | Casto | 257/676 |
| 5,296,737 | 3/1994 | Nishimura et al. | 257/673 |
| 5,331,235 | 7/1994 | Chun | 257/777 |
| 5,407,864 | 4/1995 | Kim | 437/203 |
| 5,428,248 | 6/1995 | Cha | 257/676 |
| 5,479,051 | 12/1995 | Waki et al. | 257/724 |
| 5,530,292 | 6/1996 | Waki et al. | 257/724 |
| 5,633,528 | 5/1997 | Abbott et al. | 257/666 |
| 5,677,567 | 10/1997 | Ma et al. | 257/666 |

*Primary Examiner*—Valencia Wallace
*Assistant Examiner*—George C. Eckert, II

[57] ABSTRACT

A bottom lead semiconductor chip stack package which includes a first body and a second body. The first body includes a pair of lead frames, each lead frame having a first lead portion and a second lead portion. A protrusion enclosed in a solder extends from the first lead portion. The first body also includes a semiconductor chip containing chip pads disposed on the surface thereof, the chip pads being connected to the solder enclosed protrusions. The second body has substantially the same structural configurations as the first body and is reversely stacked relative to the first body such that the semiconductor chips are disposed in opposing relationship relative to each other. An adhesive attaches the lead frames of the first body to the corresponding lead frames of the second body.

18 Claims, 4 Drawing Sheets

BOTTOM LEAD SEMICONDUCTOR CHIP STACK PACKAGE

BACKGROUND OF THE INVENTION

1. Field of the Invention

The present invention relates to a semiconductor chip package, and more particularly to a bottom lead semiconductor chip stack package for combining a pair of separate chips into a single package while obviating a wire bonding process and facilitating the fabrication thereof.

2. Description of the Prior Art

In a SOJ (small outline J-lead) semiconductor chip package serving as one of a variety of semiconductor packages, a semiconductor chip is mounted by an insulating tape or a paste on a paddle of a lead frame thereof. A plurality of pads in the chip are electrically connected by metallic wires to corresponding inner leads of the lead frame, followed by a resin molding of the structure. The outer leads extending from the package body molded structure are respectively formed in the "J" type configuration, thereby completing the chip package.

The thus composed conventional SOJ semiconductor chip package must pass an electrical characteristic test for its industrial application, whereby the package is mounted on or in a setting substrate for implementing its required operation, such as in a memory module.

However, the above-described conventional chip package has the disadvantage that the increased package area occupied on the substrate due to the outer leads extending from each side of the package results in a decrease in the yield due to the bending of the outer leads.

U.S. Pat. No. 5,428,248 granted to the present assignee on Jun. 27, 1995 was directed to overcoming the above disadvantage, and the patented chip package is called a BLP (bottom lead semiconductor package) which is now in mass production.

Referring to FIG. 1, the conventional bottom lead semiconductor package includes: a lead frame 2 having a plurality of substrate connection leads 2a each of which is connected to a substrate (not shown) and a plurality of chip connection leads 2b, upwardly extending from the substrate connection lead 2a. A semiconductor chip 1 is mounted by an adhesive 3 on each of the substrate connection leads 2a and a plurality of metallic wires 4 are provided for electrically connecting each of chip pads 1a to a corresponding one of the chip connecting leads 2b of the lead frame 2. The components including the wires 4, the chip 1, the lead frame 2 and the leads 2a, 2b are molded into a component by a molding resin 5 to form a package body which exposes the lower surface of each of the substrate connection leads 2a.

The thus composed conventional bottom lead semiconductor package reduces the area occupied on the substrate and prevents the outer leads from being damaged.

However, the chip pads 1a are electrically connected to the corresponding chip connection leads 2b by metallic wires 4 so that there is a limitation in making the chip package thinner because of the increase in height of the package body for accommodating the metallic wires.

Furthermore, because only a single chip is mounted in the chip package, multi-layer packages are difficult to produce, thereby restraining large integration.

Still further, the lead connection state is difficult to test.

SUMMARY OF THE INVENTION

Therefore, it is an object of the present invention to provide a bottom lead semiconductor chip stack package which enables making a chip package thinner and with a higher integration.

It is another object of the present invention to provide a bottom lead semiconductor chip package for facilitating lead connection testing when the package is mounted on a substrate.

To achieve the above-described objects, there is provided a bottom lead semiconductor chip stack package according to the present invention which includes: first and second bodies stacked in opposing relationship to each other, wherein each of the bodies includes a lead frame having first lead portions extending from a surface of each of said bodies and protruding each first lead portion having a protrusion extending in an upward direction, said protrusion being enclosed in solder, and second lead portions upwardly extending from the first lead portions, a semiconductor chip having a lower surface which is aligned on the solders, to which solders chip pads in a lower surface of the chip are attached; an adhesive by which upper surfaces of the first leads of each of the first and second bodies are attached to each other; a molding compound for filling the interior of each of the first and second bodies, enclosing the chips, and accordingly sealing an exterior of the lead frames while externally exposing a lower portion of each of the first leads and an end portion of each of the second leads.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

With reference to the accompanying drawings, the bottom lead semiconductor package in accordance with the present invention will now be described.

Figure 1:
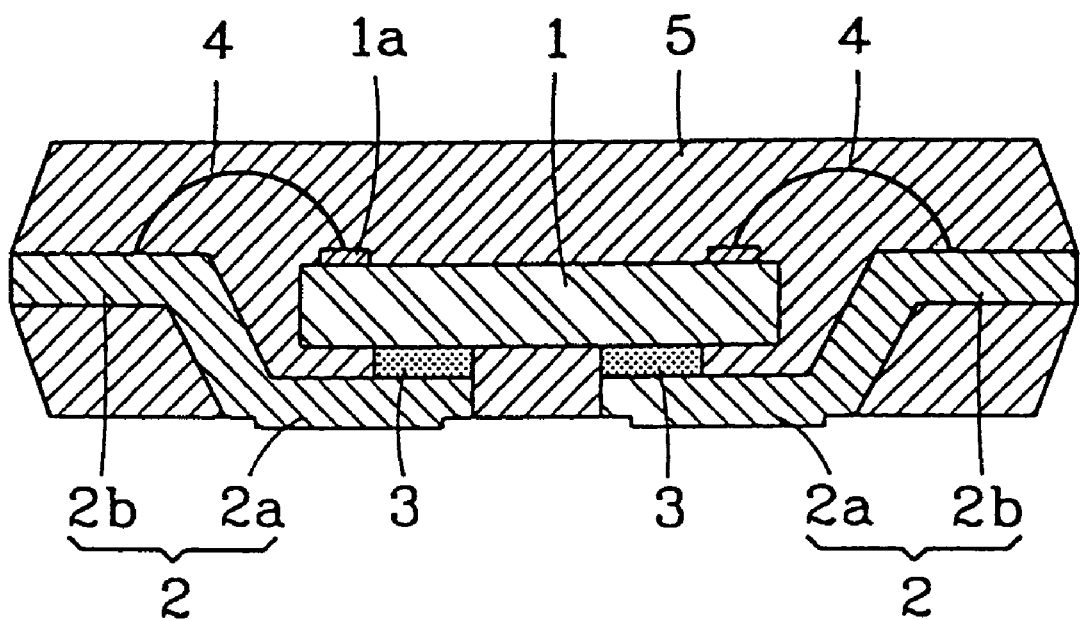
FIG. 1 is a cross-sectional view of a conventional bottom lead semiconductor package.
Figure 2A:
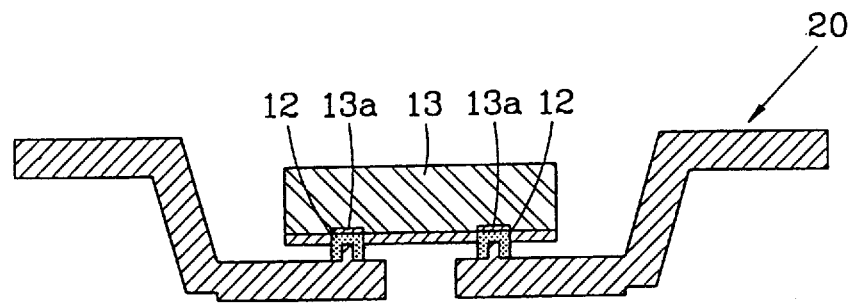
FIG. 2A through 2D are cross-sectional views showing the fabrication steps of a bottom lead semiconductor package in accordance with a first embodiment of the present invention.

First, as shown in FIG. 2A, there is provided a lead frame 10 having a plurality of first leads 10a each being connected to a substrate (not shown) and a plurality of second leads 10b, extending upwardly from each of the respective first leads 10a. Extending from the upper surface of each of the first leads 10a is a protrusion 11 which has a size and location corresponding to a chip pad 13a of chip 13 which will be later provided thereon. A paste solder 12 is plated onto each of the protrusions 11 whereby the upper surface of the solder corresponds to the chip pads 13a provided in a lower surface of the chip 13. A polyamide layer 14 is formed on the lower surface of the chip except where the chip pads 13a are located. Thus, the protrusions 11 which are enclosed by the plated solder 12 are aligned so as to be inserted into a corresponding aperture formed in the polyamide 14. Thereafter, the solder 12 is melted and hardened by heating, and the chip pads 13a in the bottom surface of the chip 13 are attached to the corresponding solders 12, whereby electric signals from or to each of the chip pads 13a may be transmitted to or from the corresponding first leads 10a. Here, the entire body shown in FIG. 2A will be referred to as a first body 20 in the following description.

The first body 20 connected to a substrate (not shown) includes: the lead frame 10 having first leads 10a, from the upper surface of which extends a protrusion 11. The second leads 10b upwardly extend from the first leads 10a. The solder 12 is plated to enclose the protrusions 11 and the semiconductor chip 13 has a chip pad 13a disposed in the lower surface thereof which is in alignment on the solders 12.

Figure 2B:
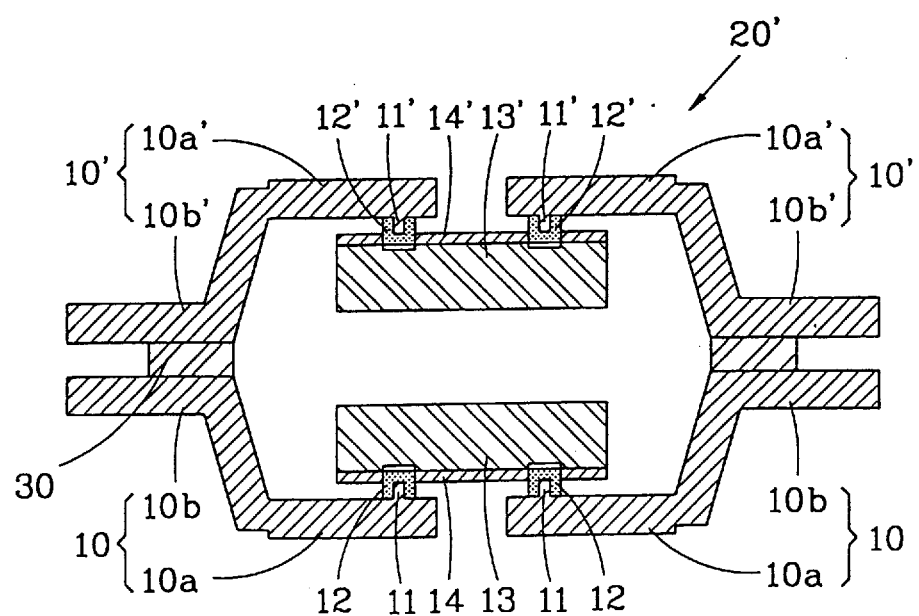

As shown in FIG. 2B, the first body 20 of FIG. 2A is reversely stacked with a second body 20' which has the same structure as the first body 20 so that the first and second bodies 20, 20' are vertically symmetrical with the chips 13 and 13' being disposed in opposing relationship. The bodies 20, 20' are attached to each other by an adhesive 30, which can be a conductive adhesive such as solder 12, or an insulating adhesive such as a polyamide. To electrically connect the second leads 10b of the first body 20 to corresponding second leads 10b' of the second body 20' there is employed a conductive adhesive, whereas an insulating adhesive is employed to insulate the respective second leads 10b, 10b'.

That is, the insulating adhesive is used to permit the chips 13, 13' to respectively perform separate functions, and the conductive adhesive is employed to permit the chips 13, 13' to fulfill an identical function.

Figure 2C:
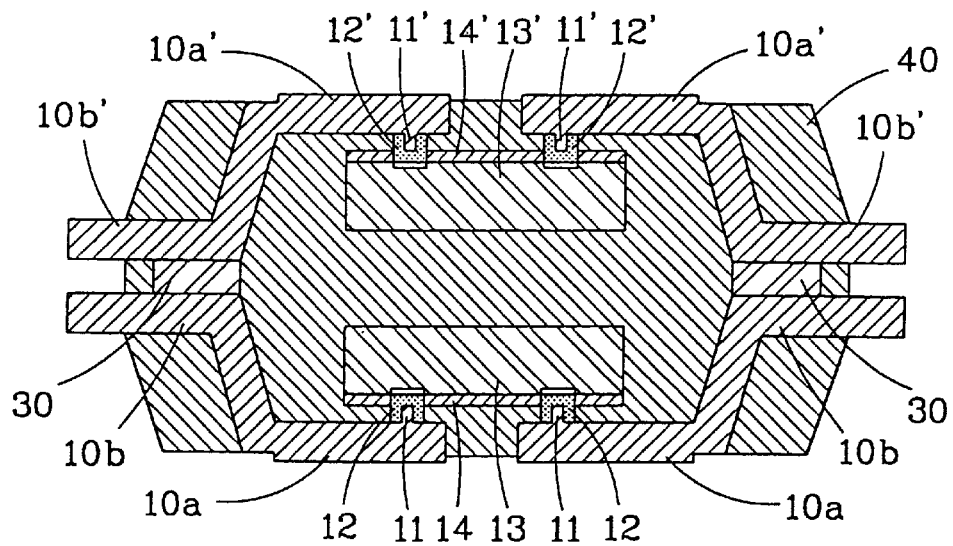

As shown in FIG. 2C, a molding compound 40 is provided to fill the interior of each of the first and second bodies 20, 20' and to enclose the chips 13, 13' and to thus seal the exterior of the lead frames 10, 10' but to externally expose the lower portion of each of the first leads 10a, 10a' and the end portion of each of the second leads 10b, 10b'. Here, the molding compound 40 is advantageously composed of an epoxy resin.

Figure 2D:
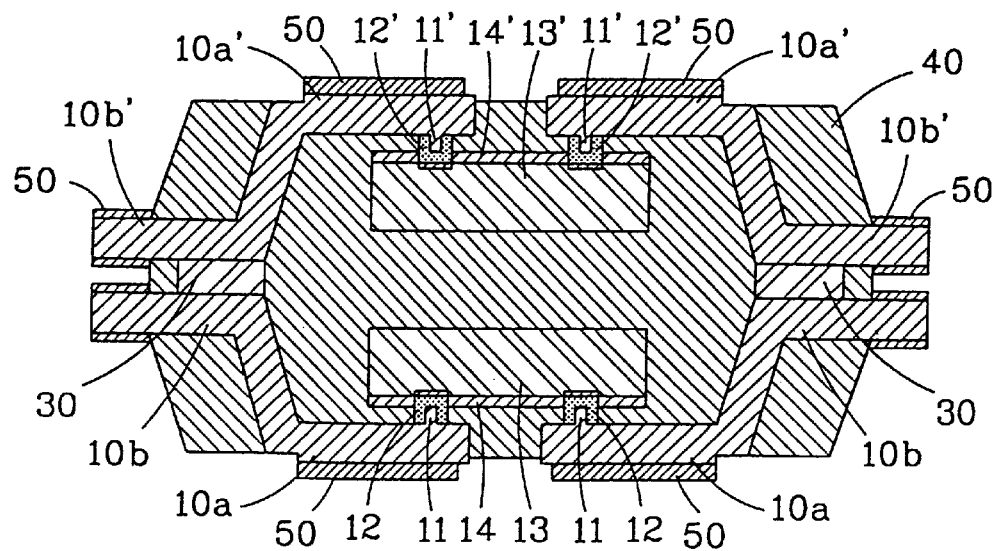

Referring to FIG. 2D, a solder film 50 is plated on each surface of the externally exposed portions of the first leads 10a, 10a' and the second leads 10b, 10b' and a trimming process is performed to cut off the externally exposed second leads 10b, 10b' to a certain length, thereby completing the bottom lead semiconductor chip stack package of the present invention.

The end portions of the second leads 10b, 10b' extend outside the molding compound 40 so that when the chip package is mounted on a substrate, the electrical connection of the first leads 10a, 10a' to the chips 13, 13' can still be tested appropriately.

Figure 3:
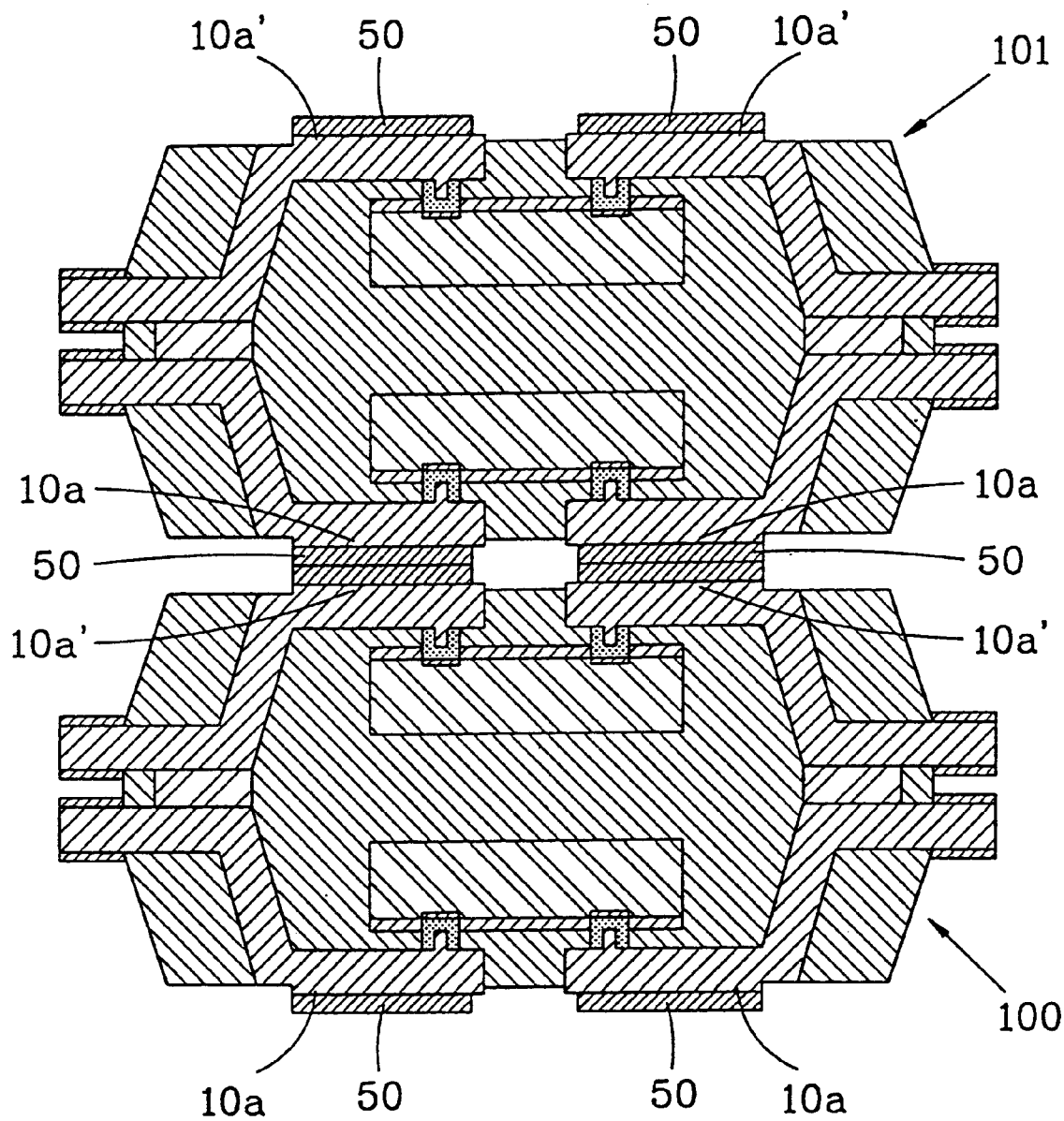
FIG. 3 is a cross-sectional view of a bottom lead semiconductor package in accordance with a second embodiment of the present invention.

FIG. 3 shows a second embodiment of the present invention, wherein a pair of bottom lead semiconductor chip stack packages 100, 101 are vertically stacked. The second embodiment of the present invention is, however, not limited to a two-layer structure, but rather the packages can be stacked into a multi-layer stacked package having at least two layers thereof. That is, the first leads 10a' of the package 100 are attached to another package 101 which has an identical structure to the package 100. Each of the solders 50 plated on each of the externally exposed surfaces of the first leads 10a, 10a' is sequentially melted and hardened for attachment. When the solder 50 is not melted, a solder cream serving as a substitute adhesive can be used to strongly attach the leads 10a, 10a' to each other. Also, the adhesive material is not confined to solder but any kind of conductive adhesive which can enhance the adhesive power can be applied.

As described above, the bottom lead semiconductor chip stack package, in accordance with the present invention, enables the chip package to be made much thinner and more highly integrated.

Further, the chip stack package according to the present invention facilitates connection testing of the leads when the chip package is mounted on a substrate.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A bottom lead semiconductor chip stack package comprising:
 a first body including
  a pair of lead frames, each lead frame having a first lead portion and a second lead portion connected to said first lead portion,
  said first lead portion containing a protrusion extending therefrom,
 a semiconductor chip containing chip pads disposed on the surface thereof, said chip pads being connected to said protrusions,
 said body being encased in a molding compound such that a surface of each of said first lead portions is disposed outside said molding compound of said package and such that a surface of each of said second lead portions is disposed to extend outside said package;
 a second body having the same structural configurations as the first body and reversely stacked relative to the first body such that the semiconductor chips are disposed in opposing relationship relative to each other, and
 an adhesive for attaching the second lead portions of the first body to the corresponding second lead portions of the second body.

2. The bottom lead semiconductor chip stack package of claim 1, wherein the adhesive is a conductive material.

3. The bottom lead semiconductor chip stack package of claim 2, wherein the conductive material is solder.

4. The bottom lead semiconductor chip stack package of claim 1, wherein the adhesive is an insulating material.

5. The bottom lead semiconductor chip stack package of claim 4, wherein the insulating material is a polyamide.

6. The bottom lead semiconductor chip stack package of claim 1, wherein the surfaces of the first and second leads are plated with a conductive film.

7. The bottom lead semiconductor chip stack package of claim 1, wherein a polyamide layer is formed on the surface of the semiconductor chips containing the chip pads, while exposing the chip pads for attachment to the solder enclosed protrusions.

8. The bottom lead semiconductor chip stack package of claim 1, wherein the first and second body together form a two-tiered structure where said first body corresponds to a first tier and said second body corresponds to a second tier.

9. The bottom lead semiconductor chip stack package of claim 8, comprising a plurality of said two-tiered structures.

10. The bottom lead semiconductor chip stack package of claim 9, wherein the plurality of two-tiered structures are disposed in a stacked configuration.

11. A bottom lead semiconductor chip stack package, comprising:

a first body and a second body reversely stacked relative to each other, wherein each of the bodies includes
lead frames having first leads containing a protrusion which extends from an upper surface thereof and second leads connected to said first leads,
a semiconductor chip containing chip pads in a surface thereof which are aligned with and attached to the corresponding protrusions;
an adhesive attaching the second leads of each of the first and second bodies to each other; and
a molding compound filling the interior of each of the first and second bodies, enclosing the semiconductor chips therein, respectively, and sealing the chip stack package; and said first leads being disposed such that a surface of each of said first leads extends outside said molding compound of said package; and
said second leads being disposed such that a surface of each of said second leads extends outside said molding compound of said package.

12. The package of claim 11, wherein the adhesive is formed of a conductive material.

13. The package of claim 12, wherein the conductive material is solder.

14. The package of claim 11, wherein the adhesive is formed of an insulating material.

15. The package of claim 14, wherein the insulating material is a polyamide.

16. The package of claim 11, wherein each surface of the first leads and the second leads is plated with a conductive film.

17. The package of claim 11, wherein on the lower surface of each semiconductor chip there is provided a polyamide layer which exposes the chip pads.

18. The package of claim 11, wherein the molding compound is an epoxy resin.

* * * * *